United States Patent [19]

Speranza et al.

[11] Patent Number: 5,985,768
[45] Date of Patent: *Nov. 16, 1999

[54] METHOD OF FORMING A SEMICONDUCTOR

[75] Inventors: Anthony C. Speranza, Austin, Tex.; Bradley P. Jones, Wappingers Falls, N.Y.

[73] Assignee: International Business Machines Corporation, Armonk, N.Y.

[*] Notice: This patent issued on a continued prosecution application filed under 37 CFR 1.53(d), and is subject to the twenty year patent term provisions of 35 U.S.C. 154(a)(2).

[21] Appl. No.: 08/845,972

[22] Filed: Apr. 30, 1997

[51] Int. Cl.$^6$ ..................................................... H01L 21/31
[52] U.S. Cl. .......................... 438/783; 438/559; 438/649; 438/664; 438/682
[58] Field of Search ....................... 438/301, 308, 438/559, 563, 384, 783, 649, 664, 682

[56] References Cited

U.S. PATENT DOCUMENTS

| | | | |
|---|---|---|---|
| 4,362,597 | 12/1982 | Fraser et al. | 156/643 |
| 4,443,930 | 4/1984 | Hwang et al. | 29/571 |
| 4,554,572 | 11/1985 | Chatterje | 357/42 |
| 4,641,417 | 2/1987 | McDavid | 29/571 |
| 4,755,478 | 7/1988 | Abernathe et al. | 437/41 |
| 4,873,204 | 10/1989 | Wong et al. | 437/200 |
| 4,877,755 | 10/1989 | Rodder | 437/200 |
| 4,886,764 | 12/1989 | Miller et al. | 437/200 |
| 4,946,550 | 8/1990 | Van Laarhoven | 156/643 |
| 5,003,375 | 3/1991 | Ichikawa | 357/71 |
| 5,055,423 | 10/1991 | Smith et al. | 437/187 |
| 5,121,186 | 6/1992 | Wong et al. | 357/71 |
| 5,166,771 | 11/1992 | Godinho et al. | 257/368 |
| 5,168,076 | 12/1992 | Godinho et al. | 438/384 |
| 5,268,330 | 12/1993 | Givens et al. | 437/195 |
| 5,358,902 | 10/1994 | Verhaar et al. | 437/192 |
| 5,407,837 | 4/1995 | Eklund | 437/21 |
| 5,569,624 | 10/1996 | Weiner | 438/308 |

OTHER PUBLICATIONS

IBM Technical Disclosure Bulletin/ vol. 30 No. 5, Oct. 1987/Self–Aligned Technique Employing . . . Silicide/HP–SAC–A Silicided Amorphous–Silicon . . . VLSI/Ed. 34, No. 3, Mar. 1987.

Primary Examiner—Charles Bowers
Assistant Examiner—Reneé R. Berry
Attorney, Agent, or Firm—Schmeiser, Olsen & Watts; Howard J. Walter, Jr.

[57] ABSTRACT

The present invention discloses a method of doping and preventing silicide formation in selective areas of a polysilicon gate in MOS, PMOS, NMOS or CMOS manufacturing technologies. The process includes the steps of: depositing a non-conformal dopant containing layer on the top surface of the body and the top surface of the polysilicon gate; removing a portion of the non-conformal dopant containing layer to expose the top surface of the polysilicon gate; and heating to diffuse dopant from the dopant containing layer. Silicidation is then provided by depositing a metal layer and annealing the metal layer. As a first alternative method, the heating and removing step may be reversed. As a second alternative method, after removal of the non-conformal layer, a metal layer can be deposited followed by a combination anneal of the metal layer and non-conformal dopant containing layer.

39 Claims, 7 Drawing Sheets

METHOD OF FORMING A SEMICONDUCTOR

BACKGROUND OF THE INVENTION

1. Technical Field

The present invention relates generally to a method of forming a semiconductor and, more specifically, to a method of selectively doping, or selectively doping and preventing silicide formation in a single process.

2. Background Art

Heretofore, crystal damage or defects, such as extended loop dislocations that penetrate source/drain junctions, contribute to cell leakage resulting in reduced dynamic random access memory (DRAM) retention time (Rt) and cause much higher power consumption. These crystal defects have long been attributed to and directly modulated by the high dose ion implant required for source-drain doping.

Additional device leakage and DRAM Rt degradation is attributable to "over the spacer" titanium silicide (TiSi) stringers. These stringers also cause discrete failures in the complementary metal oxide semiconductor (CMOS) logic products. Furthermore, these defects, typified by TiSi "creep", are also major contributors to chip field failures and reliability problems.

SUMMARY OF THE INVENTION

In accordance with a first aspect of the present invention is a method utilizing solid source diffusion to replace the source-drain ion implant. In the solid source diffusion process according to this invention, instead of using an ion implant followed by an activation anneal, dopant containing material is deposited on a body. The dopant material can then be removed in selective regions of the body, e.g. the polysilicon gates. This is then followed by a high temperature diffusion. Alternatively, the heat diffusion could precede the removal in selective regions. As an alternative following either process above, the dopant containing layer remaining may be left in place as a mask for the silicidation process (laying of a metal layer followed by annealing). Accordingly, silicide formation occurs only in the selective areas where the dopant layer is removed. Hence, masking for silicidation can be achieved at the same time doping is provided. Using this technique, dramatic improvements in DRAM Rt can be obtained by providing very low levels of junction leakage. Additionally, reduced leakage can also improve logic device performance.

As a further alternative, after deposition of the dopant containing layer, selective removal of the layer and deposition of a metal layer, (preferably cobalt) a combination anneal can be provided to drive-in the dopant and form the silicide. The doping and silicidation process, therefore, being completed simultaneously while also improving logic device performance.

In accordance with the present invention, the device created by the above methods overcomes the aforementioned defect generating problems. Furthermore, the present invention provides the improvements in defect immunity while also allowing high performance and low resistivity characteristics of silicide, e.g. TiSi, on top of the body, e.g., the polysilicon gates. Accordingly, quality is improved by significantly reducing leakage from both crystal related and "over-the-spacer" defects, such as TiSi "stringers". Additionally, the process operates without inhibiting the use of silicide on polysilicon which allows for high quality and performance.

Furthermore, in accordance with the present invention, N channel devices can be manufactured by the correct selection of materials and process conditions.

Additionally, in accordance with the present invention, the method can be utilized with other integration methods, such as blanket boron spin on glass (SOG) (for P channel arrays) and patterned selective removal from opposite, N type, device regions. Accordingly, the exact method of integration can be selected to present different advantages on other front end of line (FEOL) technology features.

Furthermore, in accordance with the present invention, alternate integration techniques can be used for doping and protecting only the array in a DRAM device. This operation would allow for support circuit device optimization by boron fluoride ($BF_2$) ion implant or the like independent of the array which benefits from the boron out diffusion from SOG. An additional array block mask step, however, would be required.

Also, in accordance with the present invention, the method can be adjusted for use with or without light doped drain (LDD) technology.

Lastly, in accordance with the present invention, the method is not to be limited to doping of an array in a CMOS DRAM device in that the preferred embodiments of the present invention can be applied to the manufacture of any MOS device including PMOS, NMOS or CMOS technology. Furthermore, the dopant layer may be provided using a variety of materials, for instance, doped oxides or doped SOG. The oxides may be deposited from tetra-ethyl-ortho silicate (TEOS) or silane ($SiH_4$) using thermal or plasma enhanced chemical vapor deposition (PECVD) processes. Due to different conformalities of the various films, however, the chemical mechanical polishing (CMP) process would have to be adjusted accordingly.

The foregoing and other features and advantages of the invention will be apparent from the following more particular description of preferred embodiments of the invention.

BRIEF DESCRIPTION OF THE DRAWINGS

The preferred embodiments of this invention will be described in detail, with reference to the following figures, wherein like designations denote like elements, and wherein.

DESCRIPTION OF THE PREFERRED EMBODIMENTS

Although the present invention will be described with regard to a CMOS DRAM device, it should be understood that the present invention is equally useful in other types of MOS device including PMOS, NMOS or CMOS technology.

Figure 1:
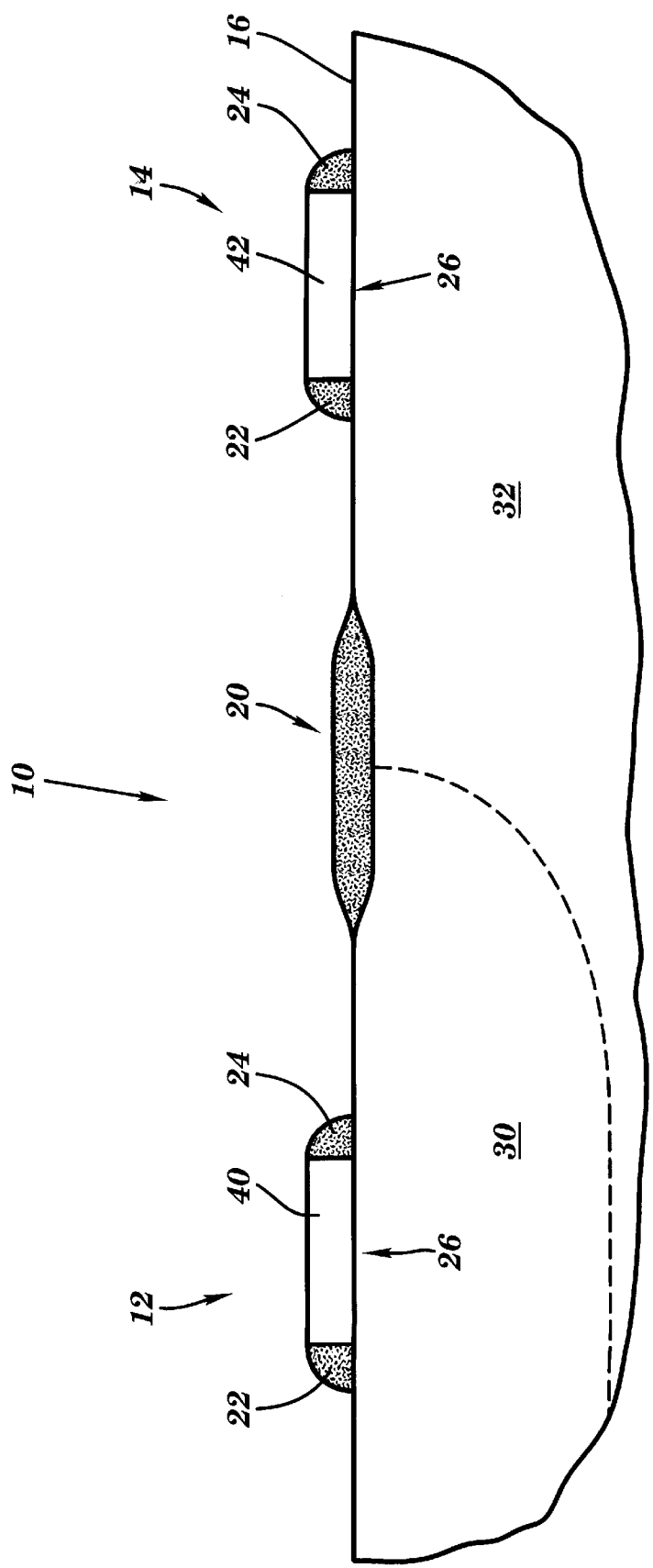
FIG. 1 shows a cross-sectional schematic of a standard CMOS in a post spacer etched clean state.

FIG. 1 depicts an integrated circuit (IC) device 10 conventionally fabricated but with the source-drain structure removed for simplicity. The IC device body 16 may be constructed using standard CMOS processing such as blanketing of polysilicon and patterning by lithography and etching. It should be recognized, however, that the body can be formed of any semiconducting material, most commonly used being silicon and gallium-arsenide. The etching can be provided in the form of reactive ion etching (RIE), wet etching, sputter etching, ion milling, plasma etching or a combination of these techniques. Polysilicon gates or word lines 12, 14 are each attached to the body or wafer 16. Each polysilicon gate has a section of polysilicon 40, 42, and spacers 22, 24 on either side. The polysilicon gates 12, 14 may be separated from the body 16 by gate oxide 26. Separating the N well 30 and P well 32 is a recessed oxide area 20. However, this invention may be used with any device isolation (other than recessed oxide) such as shallow trench isolation.

Figure 2:
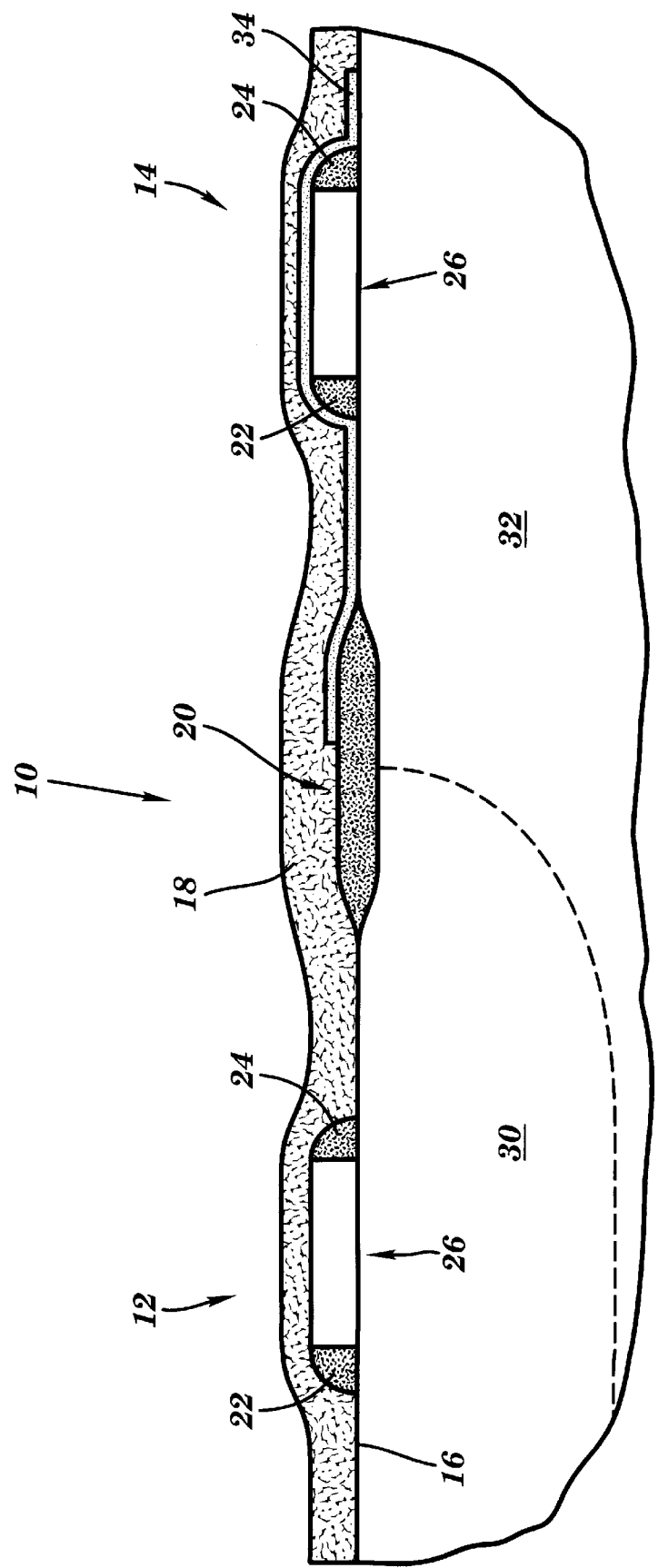
FIG. 2 shows a cross-sectional schematic of a CMOS after deposition of a non-conformal dopant layer according to the present invention.

FIG. 2 shows the IC device 10 of FIG. 1 at the first step of the process acccording to the invention. Prior to the deposition of a non-confromal dopant containing layer 18 in accordance with the inventive process, as shown on the right side of FIG. 2, a diffusion block mask 34 can be blanket deposited, for example, on the P- region 32 (N channel devices), to form the source-drain regions by ion implantation as is conventional in the art. Furthermore, this diffusion mask 34 can be selectively removed from the N well region.

In accordance with a first embodiment of the inventive process, however, a non-conformal dopant containing layer 18 is deposited across the entire silicon body 16 including the polysilicon gates 12, 14. If necessary, more than one layer 18 may be laid in selective regions of the body. The depositing of layer 18 can take a variety of forms depending on the desired effect. For example, the application of spin on glass (SOG) has the advantage of providing the best profile since it is known to thin off at the high spots, i.e., the polysilicon gates. Other possibilities for depositing the layer 18 are: chemical vapor deposition (CVD) with silicon oxide or plasma enhanced CVD (PECVD) with silicon oxide. With regard to the dopant, the layer 18 may be doped with whatever type of dopant is desired depending on the desired effect. For example, the layer 18 may be doped with at least one of boron, phophorous, arsenic or antimony. Accordingly, the dopant layer may take the form of, for example, borophosphosilicate glass (BPSG), borosilicate glass (BSG), phosphosilicate glass (PSG) or arseno-silicate glass (ASG).

If oxides are chosen, the oxides may be deposited from tetra-ethyl-ortho silicate (TEOS) or silane ($S_iH_4$) using thermal or PECVD processes. Note, however, due to the different conformality of the film, the chemical mechanical polish may need adjusting accordingly.

Following the deposition of the layer 18, the layer 18 may be cured.

Figure 3:
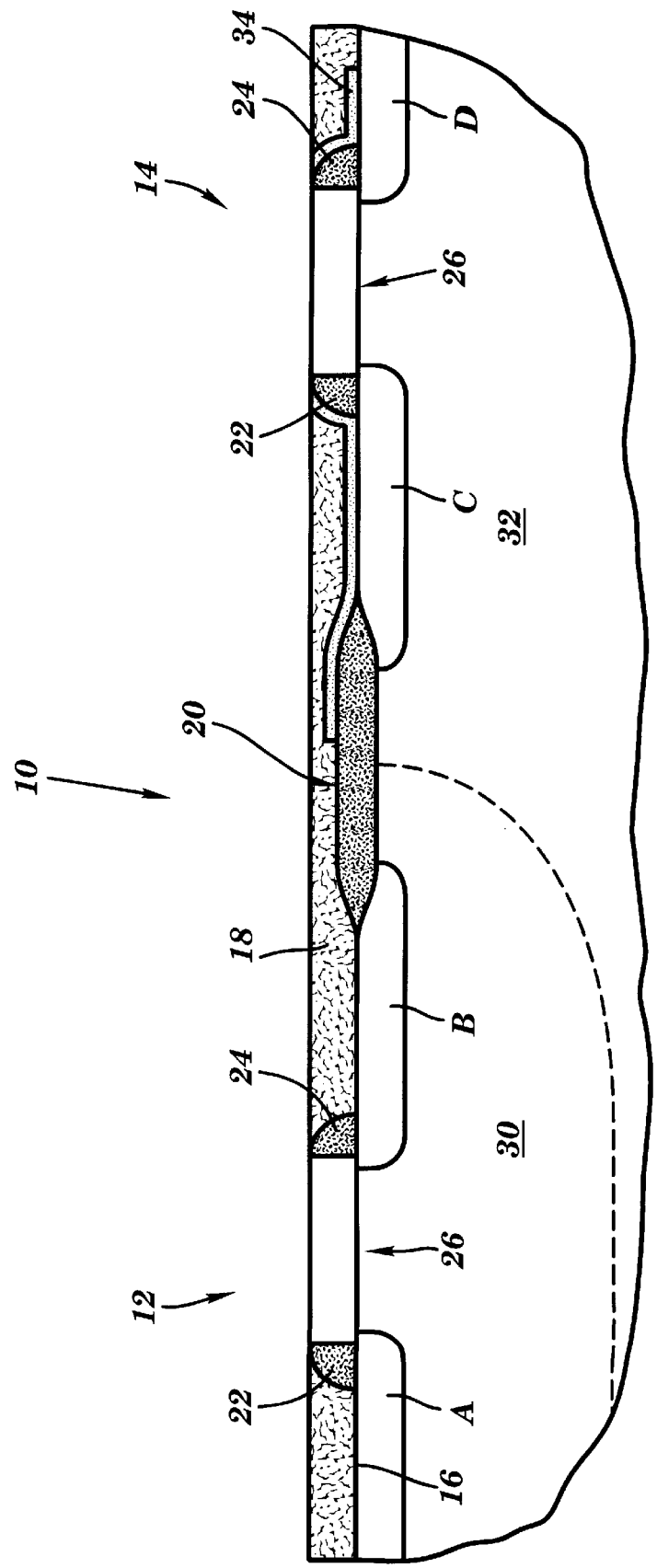
FIG. 3 shows a cross-sectional view of a CMOS after partial removal of the non-conformal dopant layer according to the present invention.

In order to allow for silicidation of the gates 12, 14, according to the inventive process, in a second step shown in FIG. 3, portions of the non-conformal dopant layer 18 covering the top surface of the polysilicon gates 12, 14 are selectively removed. The removal of the layer 18 can be performed by reactive ion etching (RIE), chemical-mechanical polishing (CMP), plasma etching, lithography and etching or a combination of these techniques.

Next, the entire device 10 is heated to diffuse the dopant from the dopant containing layer 18. This step may be performed in an atmosphere of gas (typically Ar or $N_2$). The removal of the layer 18 and diffusion of the dopant allows for the activation of the dopants to drive-in the source-drain diffusions A–D and at the same time prevents any silicide bridging from the top surfaces of the polysilicon gates or wordlines 12, 14 to the source-drain areas after silicidation takes place and the layer 18 is removed.

As a second alternative embodiment of the method, the above discussed two steps can be reversed. In other words, the step of heating the device 10 can precede the removal of the layer 18 from the top surface of the polysilicon gates 12, 14. This will allow doping of the poly word line during the anneal.

Figure 4:
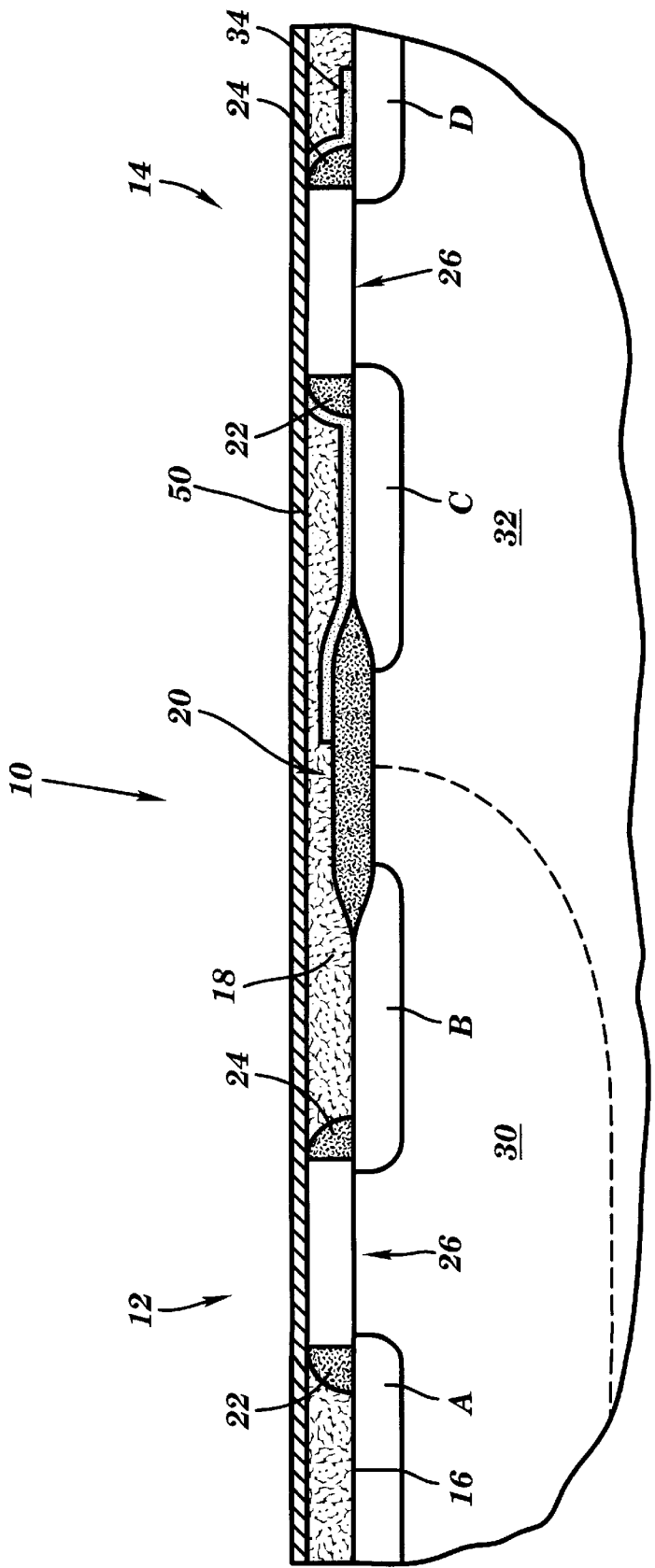
FIG. 4 shows a cross-sectional view of a CMOS after a layer of metal has been laid according to the present invention.
Figure 5:
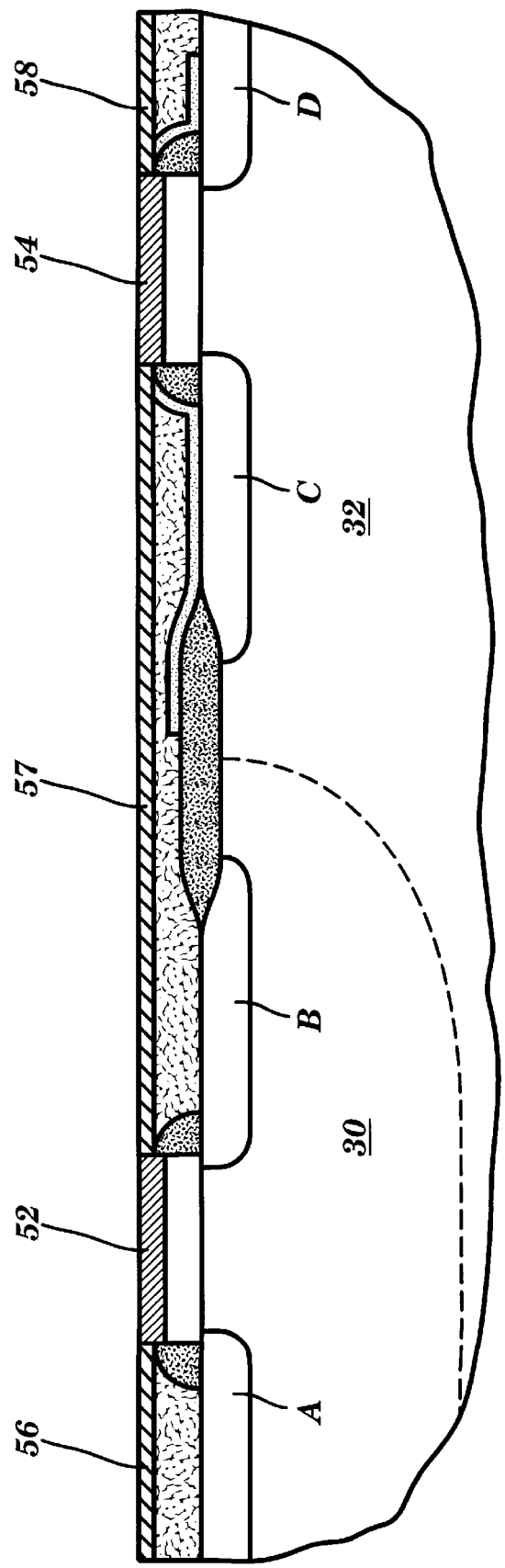
FIG. 5 shows a cross-sectional view of a CMOS after metal annealing according to the present invention.

As shown in FIG. 4, to provide the silicidation of the polysilicon gates, a metal layer 50 is deposited across the device 10 by either chemical vapor deposition (CVD) or physical vapor deposition. The type of metal can be chosen from a variety of well known elements depending on the type of silicidation desired. For instance, cobalt (Co), molybdenum (Mo), platinum (Pt), tantulum (Ta), titanium (Ti), nickel (Ni) or tungsten (W) may be used. Thereafter, the metal layer is annealed to form the silicidation 52, 54, as shown in FIG. 5. Any unreacted or un-annealed portion 56, 57, 58 of the metal layer may be removed by etching, i.e. wet chemical etching.

Figure 6:
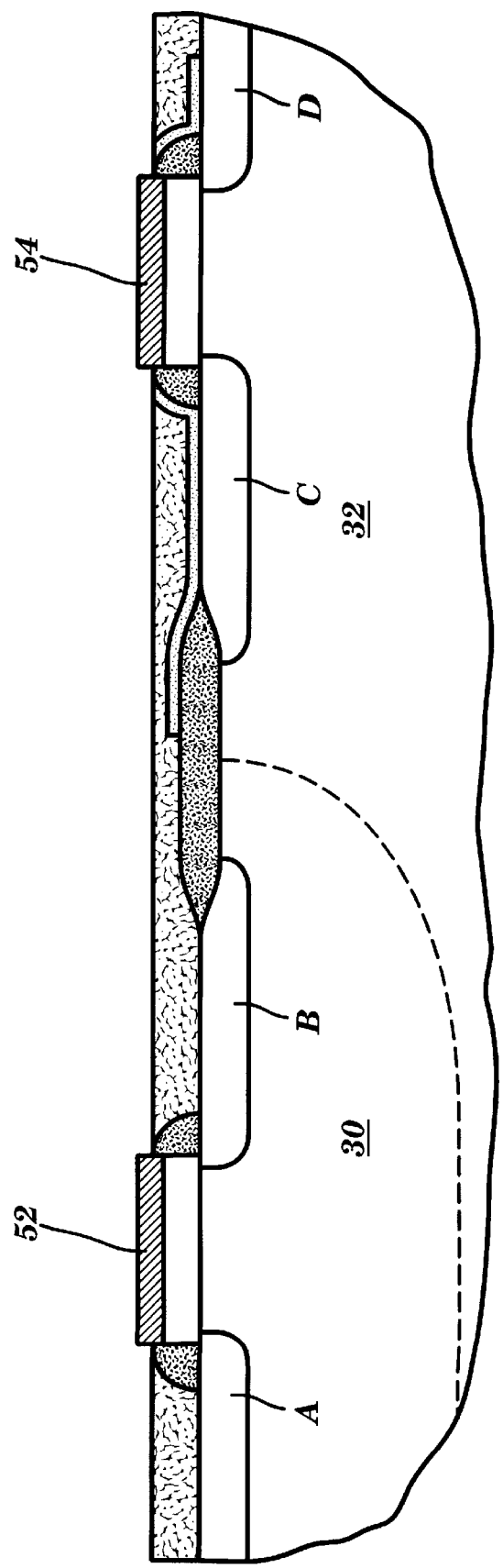
FIG. 6 shows a cross-sectional view of a CMOS after removal of unreacted metal according to an embodiment of the present invention.
Figure 7:
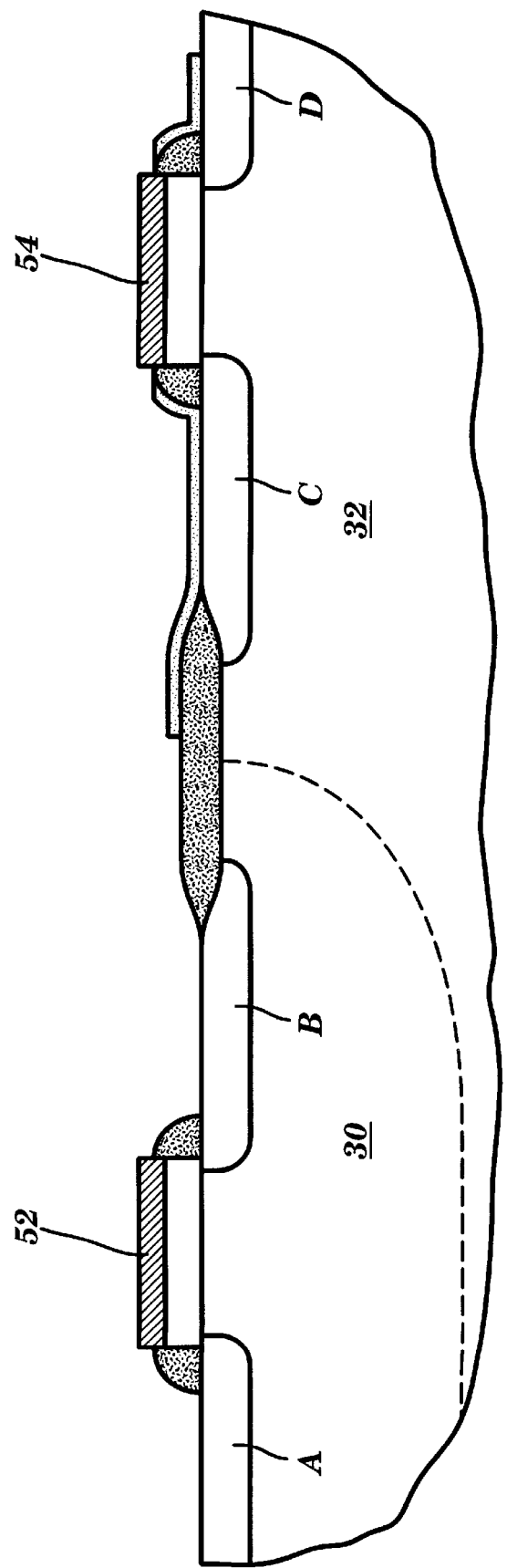
FIG. 7 shows a cross-sectional view of a CMOS after removal of the non-conforming dopant layer according to an embodiment of the present invention.

Lastly, to complete the process, as shown in FIG. 6, any unreacted or un-annealed portion 56, 57, 58 of the metal layer 50 is removed and, as shown in FIG. 7, the non-conformal layer 18 may be removed if desired. Furthermore, the diffusion block mask 34 can be removed if desired. FIG. 6 shows the CMOS with the un-silicidized metal layer and non-conformal layer 18 removed but the diffusion block mask intact.

To further reduce costs and complexity, a third alternative embodiment of the method is disclosed. After deposition of the non-conformal dopant containing layer 18 and subsequent removal of the layer 18 on the top surfaces of the polysilicon gates 12, 14, the metal layer 50 and the remaining portions of the non-conformal dopant containing layer 18 can be annealed together. In this case, the metal layer is preferably cobalt (Co), molybdenum (Mo), titanium (Ti), tantalum (Ta) or tungsten (W) since these are known silicide forming metals capable of withstanding the required annealing temperature for the process, approximately 900° C. This process, therefore, removes the necessity to heat the body twice to drive in the dopant and later to anneal the metal layer to form silicide.

While this invention has been described in conjunction with the specific emdodiments outlined above, it is evident that many alternatives, modifications and variations will be apparent to thosed skilled in the art. Accordingly, the preferred embodiments of the invention as set forth above are intended to be illustrative, not limiting. Various changes may be made without departing from the spirit and scope of the invention as defined in the following claims.

In particular, other integration methods can be utilized. Further, the method can be used with or without lightly doped drain (LDD) technology, and in any MOS device including PMOS, NMOS or CMOS manufacturing technologies.

We claim:

1. A method of forming a semiconductor including a body, comprising the steps of:

a) depositing a dopant containing layer across the body;

b) selectively removing a portion of the dopant containing layer to expose at least one structure on the body;

c) heating to diffuse dopant from the dopant containing layer; and d) using the dopant containing layer as a mask for silicide forming processing.

2. The method of claim 1, wherein the silicide forming processing includes:

d) depositing a metal layer over the body; and e) annealing the metal layer.

3. The method of claim 2, further including the step of removing any unreacted portion of the metal layer by etching.

4. The method of claim 3, further including the step of removing the dopant containing layer after the unreacted portion of the metal layer is removed.

5. The method of claim 2, wherein the step of depositing a metal layer is provided by at least one of chemical vapor deposition and physical vapor deposition.

6. The method of claim 2, wherein the step of depositing a metal layer includes depositing a layer selected from the group consisting of: cobalt (Co), molybdenum (Mo), platinum (Pt), tantulum (Ta), titanium (Ti), nickel (Ni), and tungsten (W).

7. The method of claim 1, wherein the step of removing a portion of the dopant containing layer includes removing the dopant containing layer from a surface of at least one polysilicon gate on the body.

8. The method of claim 2, wherein each of the polysilicon gates includes spacers on the sides.

9. The method of claim 1, wherein the step of depositing the dopant layer includes one of applying a spin on glass (SOG), chemical vapor deposition (CVD) with silicon oxide, and plasma enhanced CVD with silicon oxide, and wherein the dopant layer contains at least one of boron, phosphorous, arsenic and antimony.

10. The method of claim 1, wherein the step of depositing a dopant containing layer includes the further step of curing the dopant containing layer.

11. The method of claim 1, wherein the body is formed of one of silicon and gallium-arsenide.

12. The method of claim 1, wherein the body is formed by blanket deposition of polysilicon and patterned by lithography and etching.

13. The method of claim 12, wherein the etching is at least one of reactive ion etching, wet etching, sputter etching, ion milling and plasma etching.

14. The method of claim 1, wherein the step of depositing the dopant containing layer includes depositing more than one layer in some regions of the body.

15. The method of claim 1, wherein the step of depositing further includes depositing a layer of silicon nitride in some regions of the body prior to depositing the dopant containing layer.

16. The method of claim 1, wherein the step of heating to diffuse the dopant includes the step of heating the body in an atmosphere of gas.

17. A method of forming a semiconductor including a body, comprising the steps of:

a) depositing a dopant containing layer across the body;

b) heating to diffuse dopant from the dopant containing layer;

c) selectively removing a portion of the dopant containing layer to expose at least one structure on the body; and d) forming silicide using the dopant containing layer as a mask.

18. The method of claim 17, wherein the step of forming silicide includes:

d) depositing a metal layer over the body; and e) annealing the metal layer.

19. The method of claim 18, further including the step of removing any unreacted portion of the metal layer by etching.

20. The method of claim 19, further including the step of removing the dopant layer after the unreacted portion of the metal layer is removed.

21. The method of claim 18, wherein the step of depositing a metal layer is provided by at least one of chemical vapor deposition and physical vapor deposition.

22. The method of claim 18, wherein the step of depositing a metal layer includes depositing a layer of one of cobalt (Co), molybdenum (Mo), platinum (Pt), tantulum (Ta), titanium (Ti), nickel (Ni), and tungsten (W).

23. The method of claim 17, wherein the step of removing a portion of the dopant containing layer includes removing the dopant containing layer from a surface of at least one polysilicon gate on the body.

24. The method of claim 23, wherein each of the polysilicon gates includes spacers on the sides.

25. The method of claim 17, wherein the step of depositing the dopant layer includes one of applying a spin on glass (SOG), chemical vapor deposition (CVD) with silicon oxide, and plasma enhanced CVD with silicon oxide, and wherein the dopant layer contains at least one of boron, phosphorous, arsenic and antimony.

26. The method of claim 17, wherein the step of depositing a dopant containing layer includes the further step of curing the dopant containing layer.

27. The method of claim 17, wherein the body is formed of one of silicon and gallium arsenide.

28. The method of claim 17, wherein the step of providing a body includes forming the body by blanket deposition of polysilicon and patterning by lithography and etching.

29. The method of claim 28, wherein the etching is at least one of reactive ion etching, wet etching, sputter etching, ion milling and plasma etching.

30. The method of claim 17, wherein the step of depositing the dopant containing layer includes depositing more than one layer in some regions of the body.

31. The method of claim 17, wherein the step of depositing further includes depositing a layer of silicon nitride in some regions of the body prior to depositing the dopant containing layer.

32. The method of claim 17, wherein the step of heating to diffuse the dopant includes the step of heating the body in an atmosphere of gas.

33. A method of forming a semiconductor including a body, comprising the steps of:

a) depositing a dopant containing layer across the body;

b) selectively removing a portion of the dopant containing layer to expose at least one structure on the body;

c) depositing a metal layer over the body; and d) annealing the metal layer and remaining dopant containing layer to simultaneously form silicide and diffuse dopant from the dopant containing layer.

34. A method of forming a semiconductor including a body, comprising the steps of:

a) depositing a dopant containing layer across the body;

b) selectively removing a portion of the dopant containing layer to expose at least one structure on the body; and c) forming silicide using the dopant containing layer as a mask.

35. The method of claim 34, wherein the step of forming silicide includes:

d) depositing a metal layer over the body; and e) heating to simultaneously diffuse dopant from the dopant containing layer and form silicide on the at least one structure.

36. The method of claim 34, further comprising the step of heating to diffuse dopant from the dopant containing layer prior to the step of selectively removing a portion of the dopant containing layer.

37. The method of claim 36, wherein the step of forming silicide includes:

d) depositing a metal layer over the body; and e) annealing the metal layer to form silicide on the at least one structure.

38. The method of claim 34, further comprising the step of heating to diffuse dopant from the dopant containing layer after the step of selectively removing a portion of the dopant containing layer.

39. The method of claim 38, wherein the step of forming silicide includes:

d) depositing a metal layer over the body; and e) annealing the metal layer to form silicide on the at least one structure.

\* \* \* \* \*